United States Patent [19]

Michii et al.

[11] Patent Number: 5,053,855
[45] Date of Patent: Oct. 1, 1991

[54] PLASTIC MOLDED-TYPE SEMICONDUCTOR DEVICE

[75] Inventors: Kazunari Michii; Tatsuya Hirai, both of Itami, Japan

[73] Assignee: Mitsubishi Denki Kabushiki Kaisha, Japan

[21] Appl. No.: 577,797

[22] Filed: Sep. 5, 1990

Related U.S. Application Data

[63] Continuation of Ser. No. 291,959, Dec. 30, 1988, abandoned.

[30] Foreign Application Priority Data

Oct. 25, 1988 [JP] Japan .................. 63-267190

[51] Int. Cl.⁵ ............................................. H01L 23/02
[52] U.S. Cl. .................................... 357/81; 357/70; 357/72; 357/74; 357/80; 361/381; 361/386
[58] Field of Search .............. 357/69, 70, 74, 80, 357/72, 73, 81, 82; 361/386, 381

[56] References Cited

U.S. PATENT DOCUMENTS

| 3,930,114 | 12/1975 | Hodge | 357/72 |
| 3,942,245 | 3/1976 | Jackson et al. | 357/70 |
| 4,326,238 | 4/1982 | Takeda et al. | 357/81 |
| 4,415,025 | 11/1983 | Horvath | 357/81 |
| 4,561,011 | 12/1985 | Kohara et al. | 357/81 |
| 4,607,276 | 8/1986 | Butt | 357/81 |
| 4,620,215 | 10/1986 | Lee | 357/81 |
| 4,642,716 | 2/1987 | Wakabayashi et al. | 357/81 |
| 4,922,324 | 5/1990 | Sudo | 357/74 |

FOREIGN PATENT DOCUMENTS

| 58-33857 | 2/1983 | Japan | 357/81 |
| 59-178754 | 10/1984 | Japan | 357/81 |
| 59-164243 | 11/1984 | Japan | 357/72 |
| 59-202656 | 11/1984 | Japan | 357/81 |
| 60-180130 | 9/1985 | Japan | 357/81 |
| 0285450 | 12/1987 | Japan | 357/70 |

Primary Examiner—Andrew J. James
Assistant Examiner—Minhloan Tran
Attorney, Agent, or Firm—Leydig, Voit & Mayer

[57] ABSTRACT

A semiconductor device comprises a die pad having first and second surfaces; a semiconductor chip having a plurality of electrodes and mounted on the first surface of the die pad; a radiator attached by caulking to the second surface of the die pad; a plurality of leads each of which has one end electrically connected to a corresponding electrode of the chip; and a resin package in which the die pad, the semiconductor chip, the radiator and the ends of the leads are molded. This semiconductor device exhibits excellent thermal radiator properties.

12 Claims, 2 Drawing Sheets

PLASTIC MOLDED-TYPE SEMICONDUCTOR DEVICE

This application is a continuation of application Ser. No. 07/291,959 filed Dec. 30, 1988 now abandoned.

BACKGROUND OF THE INVENTION

The present invention relates to a semiconductor device, and particularly to a small plastic molded-type semiconductor device having many pins or leads.

DESCRIPTION OF THE RELATED ART

The structure of a conventional small plastic molded-type semiconductor device having many pins is shown in FIGS. 3 and 4. In this semiconductor device, a semiconductor chip 1 is mounted on a die pad 2, and a plurality of electrodes 3 which are formed on the surface of the semiconductor chip 1 are each electrically connected to the inner leads 5 of corresponding leads 4 through fine metal wires 6 such as Au wires. The semiconductor chip 1, the die pad 2, the inner leads 5 and fine metal wires 6 are molded in a package body 8 formed of resin so that only the outer leads 7 of the leads 4 are exposed to the air.

During operation of such a semiconductor device, the semiconductor chip 1 generally generates a certain amount of heat which dissipates to the outside thereof through the package body 8 and the leads 4.

Since, however, the resin such as epoxy resin which forms the package body 8 has low thermal conductivity, the heat generated from the semiconductor chip 1 is not efficiently radiated to the outside of the semiconductor device. Thus a part of the heat remains in the semiconductor device. The use of the semiconductor chip 1 generating a large amount of heat therefore involves problems in that the temperature of the semiconductor chip 1 may rise, resulting in the occurrence of operational errors which may lead, for example, to reduced reliability of the semiconductor device.

One method of improving the heat radiation properties involves connecting radiation fins to the die pad 2 in such a manner that the former are exposed to the air through the side of the package body 8. As the leads 4 cannot be provided in the portion where the radiation fins are exposed, however, this method cannot be applied to a semiconductor device having many pins which includes a semiconductor chip 1 having a multitude of electrodes 3 formed over the entire periphery thereof without leaving any room for radiation fins, as shown in FIGS. 3 and 4.

Although use of a ceramic material having superior thermal conductivity compared with resin to form the package body 8 improves the heat radiation properties of semiconductor devices, the ceramic material is significantly more expensive than resin and thus increases production costs.

SUMMARY OF THE INVENTION

The present invention has been achieved with a view to resolving the above-described problem, and it is an object of the present invention to provide a plastic molded-type semiconductor device having excellent heat radiation properties.

The plastic molded-type semiconductor device according to the present invention comprises a die pad having a first and a second surface, a semiconductor chip having a plurality of electrodes and mounted on the first surface of the die pad, a radiator mounted by caulking to the second surface of the die pad, a plurality of leads each having one end electrically connected to the corresponding electrode of the semiconductor chip, and a resin package body molding the die pad, the semiconductor chip, the radiator and the ends of the leads.

DESCRIPTION OF THE PREFERRED EMBODIMENT

An embodiment of the present invention is described below with reference to the attached drawings.

Figure 1:
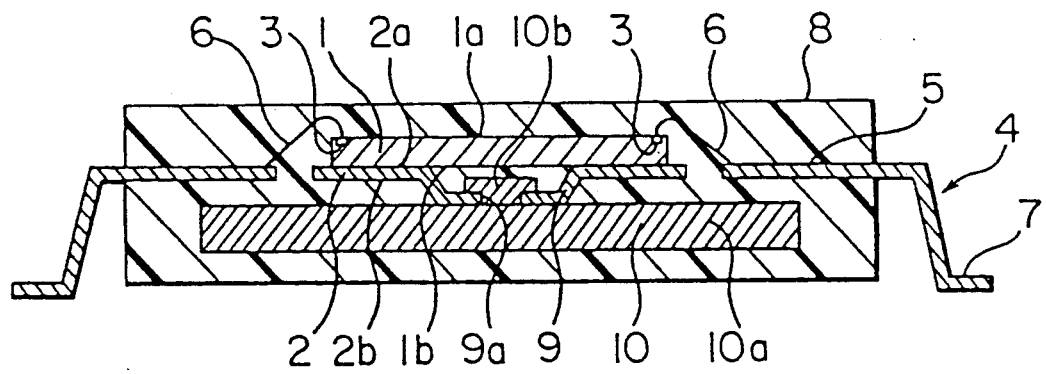
FIGS. 1 and 2 are respectively a sectional view and a plan view of a semiconductor device according to an embodiment of the present invention.
Figure 2:
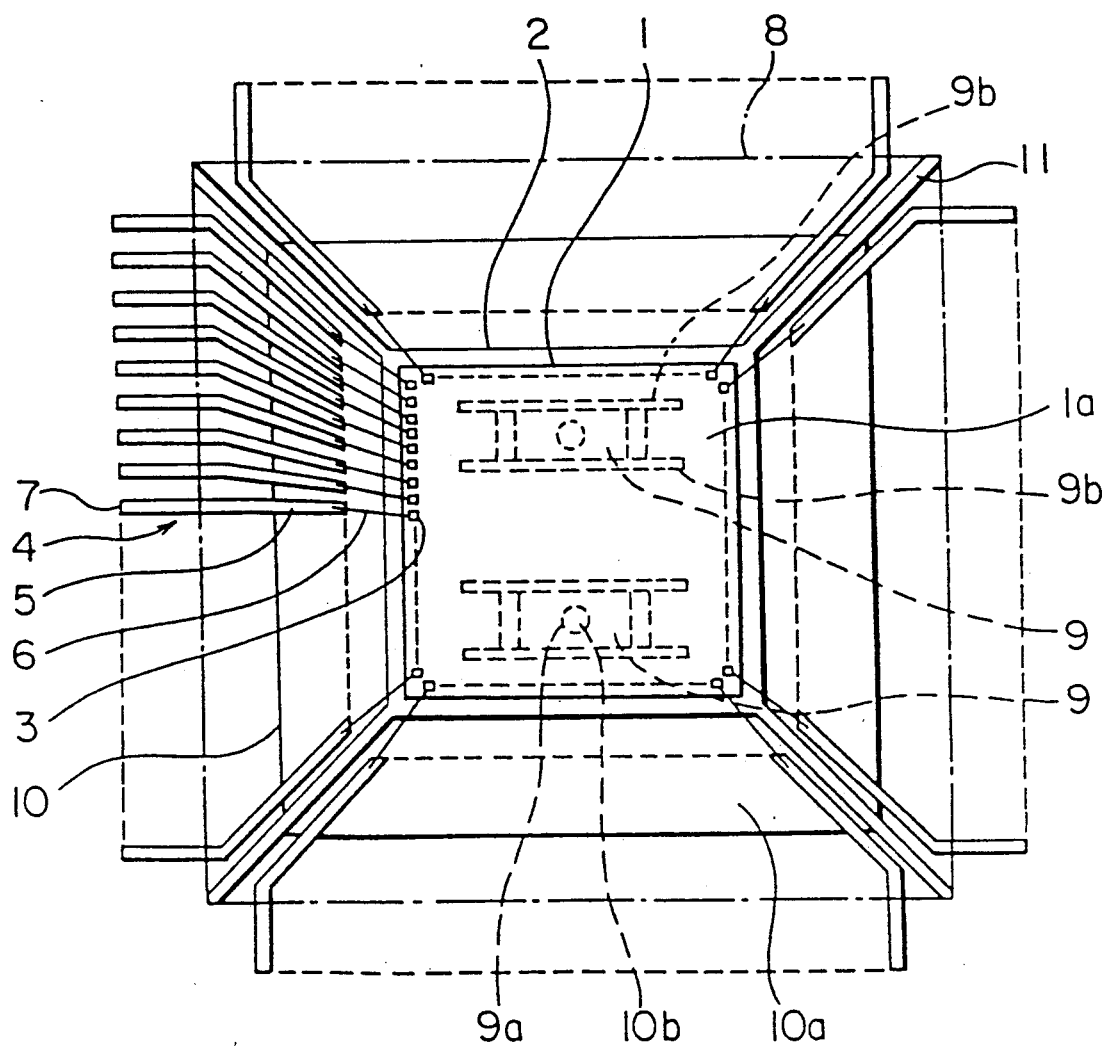

In FIGS. 1 and 2, a semiconductor chip 1 has a first surface 1a on which a plurality of electrodes 3 are formed along the entire periphery thereof, and a second surface 1b which is parallel with the first surface 1a. The second surface 1b of the semiconductor chip 1 is mounted to a first surface 2a of a die pad 2 which is made of an FeNi alloy. The die pad 2 has two concave portions 9 which are located side by side opening toward the first surface 2a thereof and which are covered by the second surface 1b of the semiconductor chip 1. A through hole 9a is formed in each of the concave portions 9 through the die pad 2 from the first surface 2a to the second surface 2b.

A radiation block 10 for radiating heat is secured to a second surface 2b of the die pad 2 on the back of the concave portions 9. Specifically, the radiation block 10 has a radiation block body 10a and two projecting portions 10b projecting from one side surface of the radiation block body 10a at locations corresponding to the through holes 9a in the concave portions 9 of the die pad 2. The projecting portions 10b are respectively inserted into the through holes 9a from the back of the concave portions 9, the tips of the projecting portions 10b being pressed to form deformed heads in the concave portions 9. The peripheries of the through holes 9a in the concave portions 9 of the die pad 2 are therefore respectively held between the radiation block body 10a and the deformed heads of the projecting portions 10b so that the radiation block 10 is fixed to the die pad 2. The radiation block 10 is formed of a material such as Cu or the like with excellent thermal conductivity. The heads of the projecting portions 10b of the radiation block 10 are completely received in the concave portions 9, leaving a certain distance between the top of the heads of the projecting portions 10b and the second surface 1b of the semiconductor chip 1 which is mounted on the die pad 2.

A plurality of leads 4 corresponding to the electrodes 3 of the semiconductor chip 1 are radially disposed around the periphery of the die pad 2 surrounding the die pad 2. Each of the leads 4 is made of an FeNi alloy or the like and has one end which faces the die pad 2 and which is electrically connected to the corresponding electrode 3 of the semiconductor chip 1 as an inner lead 5 by way of a fine metal wire 6. The semiconductor chip 1, the die pad 2, the radiation block 10, the inner leads 5 of the leads 4 and the fine metal wires 6 are molded with a package body 8 formed of resin such as epoxy resin or the like so that only the other end of each of the leads 4 are exposed to the air outside the package body 8 as an outer lead 7.

Such a semiconductor device is produced by the following method:

Each of the concave portions 9 is first formed in the die pad 2 by forming two linear parallel notches 9b at appropriate positions on the die pad 2 and the through hole 9a at the portion between the two notches 9b as shown in FIG. 2. Then the portion between the two notches 9b is rolled. The radiation block 10 is then connected with caulking to the second surface 2b of the die pad 2 on the back of the concave portions 9. In other words, the projecting portions 10b of the radiation block 10 are respectively inserted into the through holes 9a in the concave portions 9 through the second surface 2b of the die pad 2. The tips of the projecting portions 10b are then pressed and plastically deformed in the concave portions 9. The second surface 1b of the semiconductor chip 1 is subsequently bonded to the first surface 2a of the die pad 2. At the same time, the concave portions 9 of the die pad 2 are covered by the second surface 1b of the semiconductor chip 1. Since the respective heads of the projecting portions 10b of the radiation block 10 are, however, completely received in the concave portions 9 of the die pad 2, the heads of the projecting portions 10b are not brought into contact with the semiconductor chip 1 and thus do not interfere with the mounting of the semiconductor chip 1.

The electrodes 3 of the semiconductor chip 1 are then electrically connected to the inner leads 5 of the corresponding leads 4 by using the fine metal wires 6. The semiconductor chip 1, the die pad 2, the radiation block 10, the inner leads 5 of the leads 4 and the metal fine wires 6 are then resin-molded with the package body 8 to obtain the semiconductor device shown in FIGS. 1 and 2.

During the operation of such a semiconductor device, any heat generated by the semiconductor chip 1 is mainly conducted to the die pad 2 and then to the radiation block 10 which exhibits excellent thermal conductivity. The heat is then released from the radiation block 10 to the outside of the semiconductor device through the package body 8.

Figure 3:
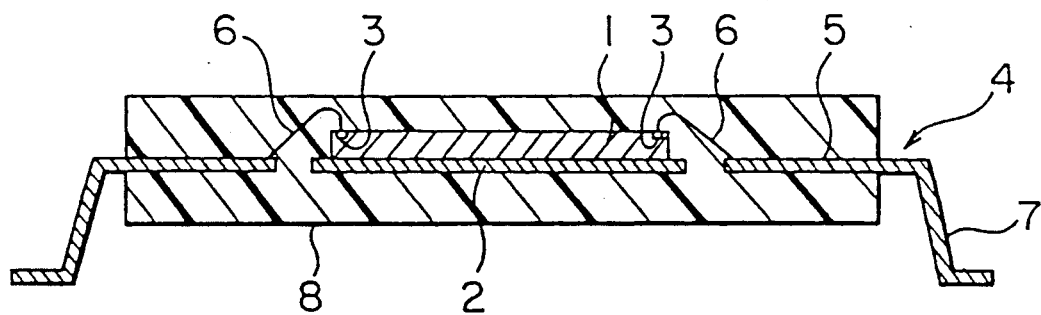
FIGS. 3 and 4 are respectively a sectional view and a plan view of a conventional semiconductor device.
Figure 4:
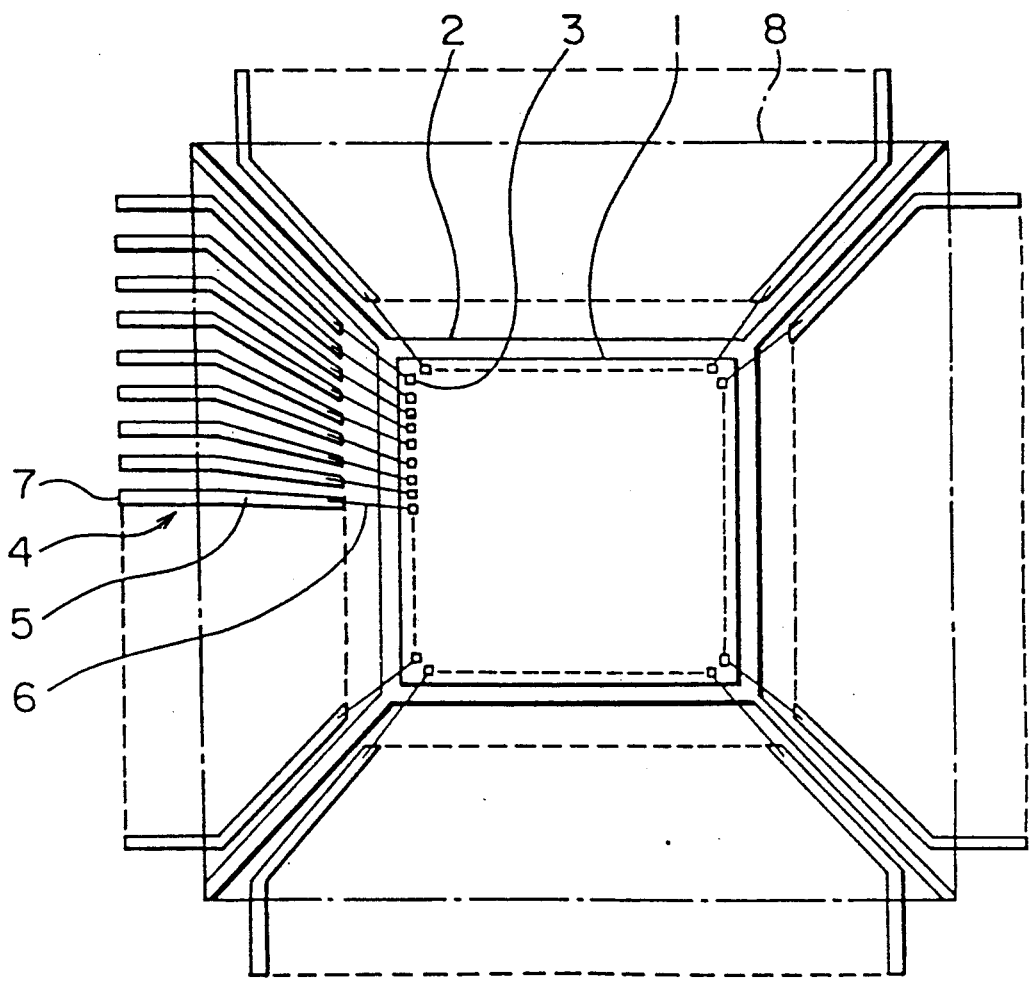

When the thermal resistance values of a semiconductor device of this embodiment were compared with those of the conventional semiconductor device shown in FIGS. 3 and 4, it was confirmed that the heat radiation property of the semiconductor device of this embodiment is improved to a level twice that of the conventional device.

Although in the above-described embodiment the radiation block 10 is connected to the die pad 2 at the two caulking portions in the two concave portions 9, feasible connection methods are not so limited and the radiation block 10 may, for example, be connected to the die pad 2 at one caulking portion or more than two caulking portions.

The radiator need not have a block shape; so long as it exhibits excellent thermal conductivity any other shape may be utilized. For example, the radiator may have a plate or rod form with the same effect being obtained.

In regard to FIG. 2, if the caulking portions are not provided in the die pad 2 but are provided in support leads 11 to allow the die pad 2 to be supported by a lead fame (not shown), the radiation block 10 can be supported by the back of the die pad 2. Since each of the caulking portions occupies a large area, however, the support leads 11 need to be wider, resulting in the number of leads 4 in the vicinity of the support leads 11 being reduced in such a case. A small semiconductor device having more pins can therefore be provided when the caulking portions are provided in the die pad 2 as in the present invention.

What is claimed is:

1. A semiconductor device comprising:
   a die pad having a chip mounting portion for mounting a semiconductor chip and a heat radiator mounting portion spaced from said chip mounting portion;
   a semiconductor chip mounted on the chip mounting portion of said die pad and having a plurality of electrodes;
   a heat radiator mounted on said heat radiator mounting portion of said die pad; and
   a resin encapsulating said semiconductor chip, said die pad, and at least part of said heat radiator, part of said resin being disposed between said chip mounting portion and said heat radiator mounting portion, wherein said heat radiator, said heat radiator mounting portion, part of said resin, and said semiconductor chip are successively disposed in a stack.

2. The semiconductor device according to claim 1 including a plurality of leads, each lead being electrically connected to a corresponding electrode on said semiconductor chip.

3. The semiconductor device according to claim 1 wherein said heat radiator mounting portion includes an opening and said radiator includes a projection disposed in the opening and engaging said heat radiator mounting portion.

4. The semiconductor device according to claim 3 wherein said projection includes a head disposed opposite said heat radiator and said head is at least partially deformed mounting said heat radiator to said die pad.

5. The semiconductor device according to claim 3 wherein said semiconductor chip has a first surface on which said plurality of electrodes are disposed and a second surface opposite said first surface mounted on said chip mounting portion of said die pad opposite said opening.

6. A semiconductor device according to claim 5 wherein said plurality of electrodes are disposed along a periphery of said first surface of said semiconductor chip.

7. The semiconductor device according to claim 1 wherein said die pad is unitary.

8. The semiconductor device according to claim 1, wherein said heat radiator is formed of copper.

9. A semiconductor device comprising:
   a unitary die pad having a chip mounting portion including opposed, generally parallel first and second surfaces, a plurality of leads, two concave portions extending away from said second surface, and a heat radiator mounting portion spaced from said second surface and joining said concave portions;
   a semiconductor chip mounted on the chip mounting portion of said die pad and having a plurality of electrodes;
   a plurality of wires electrically connecting said leads to respective electrodes of said semiconductor chip; and a heat radiator mounted on said radiator mounting portion of said die pad.

10. The semiconductor device according to claim 9 including a resin package body encapsulating said semiconductor chip, said die pad, and said heat radiator.

11. The semiconductor device according to claim 9 wherein said heat radiator mounting portion includes an opening and said heat radiator includes a projection disposed in the opening and engaging said heat radiator mounting portion.

12. The semiconductor device according to claim 11 wherein said projection includes a head disposed opposite said heat radiator and said head is at least partially deformed mounting said heat radiator to said die pad.

* * * * *